United States Patent [19]

Hogg

[11] 3,973,108

[45] Aug. 3, 1976

[54] PULSE STORING AND RETRIEVAL CIRCUIT

[75] Inventor: Walter R. Hogg, Miami Lakes, Fla.

[73] Assignee: Coulter Electronics, Inc., Hialeah, Fla.

[22] Filed: Jan. 21, 1974

[21] Appl. No.: 434,894

[52] U.S. Cl. ............................................ 235/92 PC
[51] Int. Cl.² ...................................... G06M 11/00
[58] Field of Search ............... 340/172.5; 235/92 PC

[56] References Cited
UNITED STATES PATENTS

| | | | |
|---|---|---|---|
| 3,328,772 | 2/1967 | Oeters............................. | 340/172.5 |
| 3,398,403 | 8/1968 | Ostendorf, Jr. .................. | 340/172.5 |
| 3,733,547 | 5/1973 | Coulter et al................... | 235/92 PC |
| 3,783,247 | 1/1974 | Klein et al. ..................... | 235/92 PC |

*Primary Examiner*—Harvey E. Springborn
*Attorney, Agent, or Firm*—Silverman & Cass, Ltd.

[57] ABSTRACT

A pulse storing and retrieval circuit for storing and recovering serially received pulses to be processed includes a delay line having a plurality of output locations along the length of the line. A first pulse is coupled to the delay line for propagation therethrough and is coupled from the delay line to a pulse processor for processing. Logic circuitry in the pulse storing and retrieval circuit responds to a first signal indicating detection of the pulse by the processor and an indication that processing of the pulse by the pulse processor is in progress to cause the sequential coupling in a first direction of the delay line output locations to the processor as the trailing edge of the pulse propagates down the delay line. Upon indication from the processor that it has finished its processing and a succeeding pulse can be accepted, the logic circuitry begins sequentially coupling each of the output locations of the delay line to the processor in a second direction opposite to the first direction until the leading edge of a succeeding pulse is reached. Upon detection of the succeeding pulse by the pulse processor, the logic circuitry again begins the cycle.

21 Claims, 1 Drawing Figure

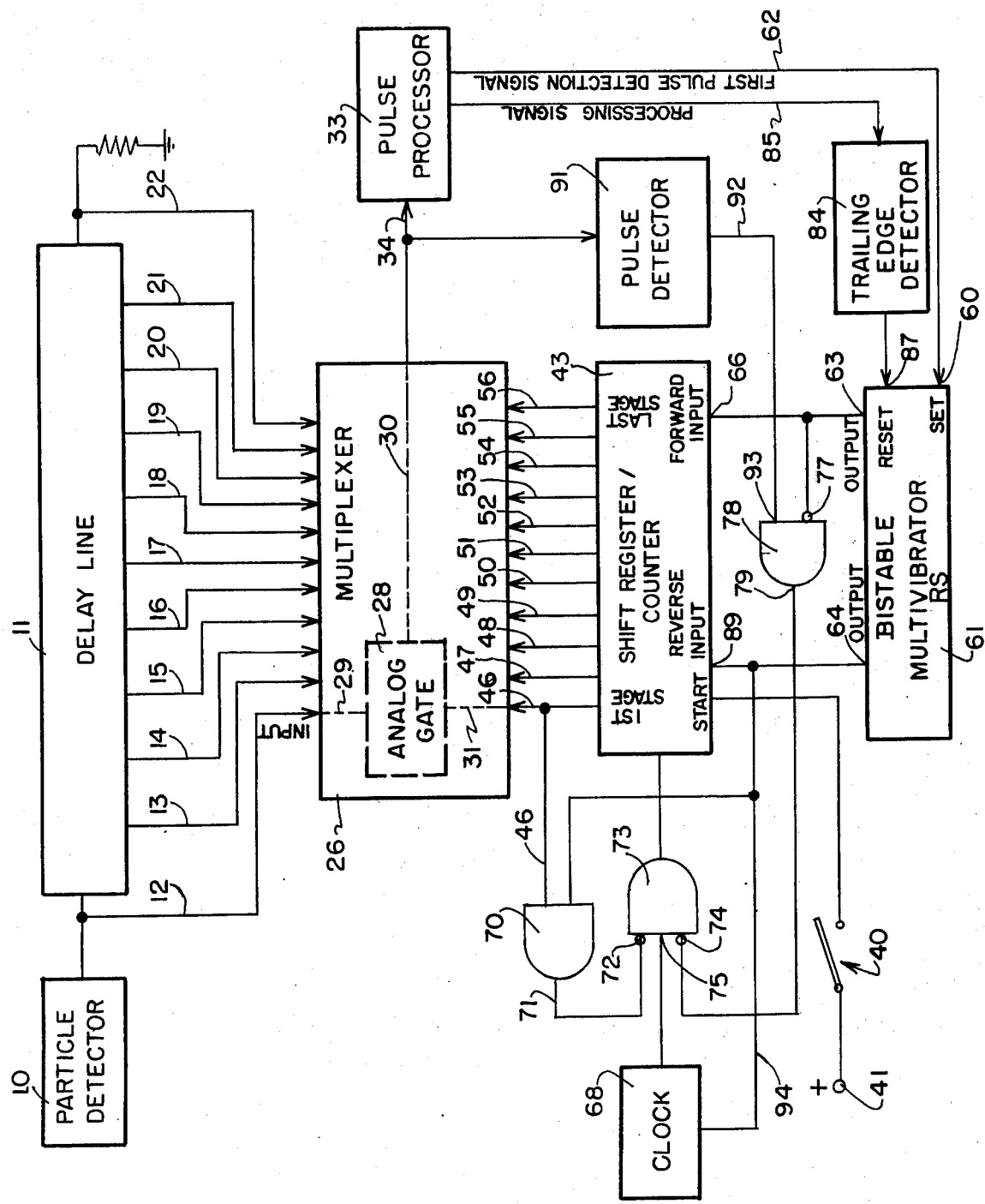

PULSE STORING AND RETRIEVAL CIRCUIT

BACKGROUND OF THE INVENTION

In the analysis and study of many types of particles such as blood particles, the particles are suspended in a liquid medium. The medium is then introduced into a particle analyzing device of the general type described and claimed in U.S. Pat. No. 3,259,842 which issued July 5, 1966 to W. H. Coulter, et al., and which is assigned to the Assignee of this invention. The particle analyzing device described in the said U.S. patent employs a Coulter type particle detector wherein a particle in the suspension medium will modulate the current flow or electric field in an aperture to produce an electrical pulse as the particle passes through the aperture. The electrical pulse is then coupled to a pulse processor where characteristics such as the pulse amplitude are analyzed in order to yield certain information regarding particle size. The pulse also can be counted in order to ascertain particle concentration.

Although particle analyzers of the Coulter type noted above have enjoyed great success for a number of years, such an instrument takes an appreciable period of time, relatively speaking, to process each pulse. For example, processors currently available can process a pulse in 50 to 100 microseconds. If there is a high concentration of particles in the suspension medium, the Coulter type particle detector may develop pulses faster than they can be processed by the pulse processor. Furthermore, even with low particle concentrations, pairs or groups of particles can arrive in rapid succession due to an uneven dispersion of particles in the fluid, causing pulses to be developed faster than can be processed by the pulse processor.

If each pulse must not only be processed but counted by the pulse processor in order to statistically analyze the particles accurately, the pulses developed by the particle detector must be stored or "frozen in time", until they can be processed by the pulse processor. If each pulse is stored for a predetermined period of time while the processor is processing a preceding pulse, the number of pulses stored will not be substantially decreased when the rate at which the pulses are produced decreases. Furthermore, when the rate at which pulses are developed increases to a point greater than the speed at which each pulse can be processed, the number of pulses in storage will increase until the full capacity of the storage device is utilized.

SUMMARY OF THE INVENTION

This invention provides a particle analyzing device of the general type described and claimed in U.S. Pat. No. 3,259,842 which includes a pulse storing circuit for storing and recovering pulses to be processed. There is provided a pulse storing circuit which stores pulses for variable time periods. Also, there is provided a pulse storing circuit which serially couples each stored pulse to the pulse processor as soon as it may be processed.

In practicing this invention, a pulse storing circuit is provided which includes a delay line having a number of outputs along the delay path. Electrical pulses from a Coulter type pulse detector are coupled to the delay line input. Each of the delay line outputs is coupled to a multiplexer whose output is coupled to a pulse processor which processes the electrical pulses. The pulse processor develops a first signal in response to detection of a pulse indicating that processing is in progress and a second signal in response to readiness to receive a succeeding pulse.

A first pulse coupled to the delay line will be coupled from the delay line to the pulse processor. Logic circuitry will operate in response to the first signal from the pulse processor indicating that processing is in progress to develop control signals in a first sequence which are coupled to the multiplexer. The multiplexer will sequentially couple each output of the delay line to the pulse processor in response to the first sequence of control signals in the direction of pulse propagation down the delay line. This couples each output of the delay line to the pulse processor as the first pulse passes the particular output. The logic circuitry will develop control signals in a second sequence in response to receipt of the second signal indicating readiness to receive a succeeding pulse. This second sequence of control signals is coupled to the multiplexer terminating further coupling of delay line outputs to the processor in the forward direction and initiating sequential coupling of the delay line outputs to the processor in a direction opposite to the propagation of pulses along the delay path. When a succeeding pulse is reached and coupled to the pulse processor, a detector will inhibit further development of control signals in the second sequence. The occurrence of another first signal in response to the detection of the succeeding pulse will initiate a new cycle.

BRIEF DESCRIPTION OF THE DRAWING

The drawing is a block diagram of a particle analyzing device having a pulse storing circuit embodying the invention.

DESCRIPTION OF THE PREFERRED EMBODIMENT

Referring to the drawing, a particle detector 10 of the well known Coulter type which produces an electrical pulse as each particle suspended in a liquid medium passes through an aperture is coupled to delay line 11. Delay line 11 may be any one of the type commonly known in the art, such as, for example, an inductance-capacitance ladder. In the preferred embodiment, delay line 11 is an analog delay line wherein a pulse propagating along the delay path of delay line 11 must be identical to the pulse as coupled to delay line 11 except for losses due to the propagation medium. A number of outputs 13 through 21 at various points along the delay path of delay line 11 are coupled to a multiplexer 26. The input and terminal points of delay line 11 also are coupled to multiplexer 26 via outputs 12 and 22 respectively. Delay line 11 for example may include devices manufactured by Artronic Instrument Co., two series N devices being employed in series, each having 100 microseconds delay and 20 outputs to provide 40 outputs at 5 microsecond spacings.

Multiplexer 26 is of the type commonly known in the art wherein a number of inputs may be individually coupled to a single output. For example, multiplexer 26 may include a number of analog gates or switches, such as analog gate 28. Analog gate 28 has a signal input 29, a signal output 30 and a control input 31. Control signals coupled to control input 31 will cause analog gate 28 to couple signal input 29 to signal output 30. The number of analog gates in multiplexer 26 is equal to the number of outputs coupled to the multiplexer 26. The outputs of each analog gate in multiplexer 27 are coupled together and to a pulse processor 33 via conductor 34. Multiplexer 26 for example may include a number of six channel MOS-FET switches manufactured by Intersil Inc. and identified by the designation G115.

Pulse processor 33 is of the type which analyzes certain characteristics of the pulse coupled thereto in order to yield specific information regarding the characteristics of the particles detected. Pulse processor 33 also may accumulate data regarding the pulses and display it in any manner well known in the art. Pulse processor 33 may be of the type disclosed in U.S. Pat. No. 3,259,842.

Shift register 43 includes a number of stages coupled in series. The number of stages in shift register 43 correspond to the number of outputs coupled to multiplexer 26 from delay line 11. Each stage of shift register 43 is coupled to a control input of one of the analog gates, such as analog gate 28, in multiplexer 26 by conductors 46 through 56. Conductor 46 is coupled to the first stage in shift register 43 and to the analog gate in multiplexer 26 which is coupled to output 12 from delay line 11. In the embodiment shown, conductor 46 is coupled to analog gate 28. Conductor 47 is coupled to the second stage of shift register 43 and to the analog gate in multiplexer 26 coupled to output 13 of delay line 11. The numerical order of conductors 48 through 56 corresponds to the numerical order of the succeeding stages in shift register 43 and to the numerical order of the outputs of delay line 11 along the delay path. Shift register 43 may include a number of Texas Instruments Type SN74198 shift registers.

Operation of the circuitry shown in the drawing is initiated by momentarily closing switch 40 thereby coupling a start pulse from supply terminal 41 to shift register 43. The start pulse coupled to shift register 43 causes shift register 43 to reset and develop a binary "one" control signal in the first stage. The remaining stages of shift register 43 each develop a binary "zero" signal. This one control signal is coupled from the first stage of shift register 43 to control input 31 of analog gate 28 in multiplexer 26 via conductor 46, causing analog gate 28 to couple signal input 29 to signal output 30. This couples lead 12 from delay line 11 to pulse processor 33 via conductor 34.

A first pulse developed in response to the detection of a particle is coupled from particle detector 10 to delay line 11. This pulse will enter the delay line and propagate along the delay path in a first direction toward the end. As conductor 12 is coupled to conductor 34 and pulse processor 33 via multiplexer 26 when the system is initialized, the first pulse will be coupled via conductor 12, multiplexer 26 and conductor 34 to pulse processor 33. Upon receipt and detector of this first pulse, pulse processor 33 will develop a detection signal in the form of a binary one, which is coupled to the set input 60 of a bistable multivibrator 61 via conductor 62. Bistable multivibrator 61 may be any one of the types well known in the art and, in the preferred embodiment is an RS type bistable multivibrator commonly known as as "RS flip flop", such as for example the Texas Instruments Incorporated SN74279. The one coupled to bistable multivibrator 61 will cause it to set and develop a one at output 63, and a zero at output 64. The one is coupled from output 63 of bistable multivibrator 61 to input 66 of shift register 43, allowing shift register 43 to sequentially shift through the stages in increasing order upon receipt of each binary one from VETO gate 73. The zero developed at output 64 of bistable multivibrator 61 is coupled to one input of AND gate 70, thus removing a one input coupled to AND gate 70. AND gate 70 will develop a zero at its output in response to the zero at an input which is coupled via conductor 71 to a veto input 72 of VETO gate 73.

VETO gate 73, in the embodiment shown, is an AND gate with inverters at inputs 72 and 74. VETO gate 73 operates such that if a one is coupled to either input terminals 72 or 74, it will inhibit VETO gate 73 from developing a one at its output in response to clock pulses coupled from clock 68 to input 75 of VETO gate 73.

The one developed at output 63 of bistable multivibrator 61 is also coupled to input 77 of VETO gate 78. VETO gate 78 will develop a zero at output 79 in response to the one coupled to input 77. The one coupled to input 77 will inhibit VETO gate 78 from developing a one at output 79. The zero developed at output 79 of VETO gate 78 is coupled to input 74 of VETO gate 73. With zeroes at inputs 72 and 74 of VETO gate 73, each clock pulse coupled from clock 68 to input 75 will cause VETO gate 73 to develop a one at its output.

Clock 68 develops clock pulses which have a period equal to the propagation time of a pulse between each output of delay line 11. Therefore, each one developed at the output of VETO gate 78 will have a period equal to the propagation time of a pulse between each output of delay line 11. With a one present at input 66 of shift register 43, the ones developed at the output of VETO gate 73 are coupled to shift register 43 causing shift register 43 to sequentially shift through the stages of the shift register in increasing order. That is, stage two will be activated in response to a one from VETO gate 73 and develop a one control signal, and the output of stage one will return to zero. Stage three will be activated in response to the succeeding one pulse from VETO gate 73 and develope a one control signal, and stage two will be deactivated, and so on through the length of the shift register. The one control signals successively developed in each stage of shift register 43 will be coupled via conductors 46 through 56 respectively to the control inputs of the analog gates in multiplexer 26 causing multiplexer 26 to sequentially couple conductor 34 and pulse processor 33 to the outputs 13 through 22 of delay line 11. As the sequential connection of outputs 13 through 22 to pulse processor 33 is equal to the period between clock pulses of clock 68, each output of delay line 11 will be coupled to pulse processor 33 as the first pulse passes the output while propagating along the delay path of delay line 11 towards the end so that only one output is connected to pulse processor 33 at any instant and all others are disconnected. This avoids inadvertently coupling a succeeding pulse which may be in the delay line and following the first pulse, 11 to pulse processor 33 thereby allowing time for pulse processor 33 to process the first pulse and simultaneously storing or freezing in time the succeeding pulse located in delay line 11.

During the processing of the first pulse, pulse processor 33 will develop a processing signal. This processing signal is coupled to a trailing edge detector 84 via conductor 85. When the processing is completed, the processing signal is terminated. Termination of the processing signal causes trailing edge detector 84 to develop a reset pulse which is coupled to reset input 87 of bistable multivibrator 61. The reset pulse causes bistable multivibrator 61 to reset and develop a zero at output 63 and a one at output 64. The one developed at output 64 of bistable multivibrator 61 is coupled to input 89 of shift register 43 causing shift register 43 to reverse the direction of sequential shifting through the stages. That is, assuming the last stage actuated in increasing order through shift register 43 was stage nine, the next one pulse coupled from VETO gate 73 to shift register 43 will cause shift register 43 to actuate stage eight. Stage eight will develop a one control signal and stage nine will revert to a zero. The succeeding one pulse from VETO gate 73 will actuate stage seven in shift register 43, and each succeeding one pulse from VETO gate 73 will cause shift register 43 to sequentially shift to a preceding stage in decreasing order through the shift register The one control signals developed in each stage of shift register 43 are coupled via conductors 56 through 46 to the analog gates in multiplexer 26 causing multiplexer 26 to sequentially couple the outputs of delay line 11 to pulse processor 33 in a direction reverse to the direction of propagation of a pulse in the forward direction along the delay path.

If a succeeding pulse is not stored in delay line 11 the sequencing of shift register 43 will continue until the first stage is reached. The one control signal developed by the first stage will be coupled via conductor 46 to one input of the AND gate 70. The one developed at output 64 of bistable multivibrator 61 is also coupled to the second input of AND gate 70 causing the AND gate 70 to develop a one at its output. The one developed by AND gate 70 is coupled via conductor 71 to input 72 of VETO gate 73. The one coupled to input 7 of VETO gate 73 will inhibit ones from being developed by VETO gate 73 in response to clock pulses from clock 68 and coupled to shift register 43 This terminates the sequencing of shift register 43 and multiplexer 26 until receipt and detection of the next pulse to be processed.

If a second pulse has been developed by particle detector 10, in response to a detection of a particle, during the processing of the first pulse by processor 33, this pulse will have been coupled to, and will be propagating through, delay line 11. This second pulse has, in effect, been stored in delay line 11 are previously noted. Pulse processor acts on the pulse for a certain period of time. When processing of the first pulse is completed, and the outputs of delay line 11 are being coupled to pulse processor 33 in a direction reverse to propagation of the pulse along the delay path, the second pulse will be coupled to conductor 34 which is the output to pulse processor 33 when the output at which the second pulse is located in delay line 11 is connected to the pulse processor. A pulse detector 91 coupled to conductor 34 will detect the presence of this second pulse and develop a one at its output. It is to be understood that pulse detector 91 is shown separately for purposes of clarity only and may be a part of pulse processor 33. Pulse detector 91, however, is separate from the detector provided by the pulse processor 33. Pulse detector 91 responds to the presence of a apulse immediately in order to stop further coupling of the delay line output in a reverse direction, thus preventing movement to another output of delay line 11 before pulse processor 33 detects a sufficient portion of the pulse to develop the detection signal at conductor 62. This one will be coupled via conductor 92 to input 93 of VETO gate 78. As a zero is being coupled from output 63 of bistable multivibrator 61 to input 77 of VETO gate 78, the one at input 93 will cause VETO gate 78 to develop a one at output 79. This one is coupled to input 74 of VETO gate 73, inhibiting VETO gate 73 from developing ones at its output in response to clock pulses from clock 68. With ones no longer being developed at the output of VETO gate 73, shift register 43 will terminate its sequential shifting and sequential development of control signals. Multiplexer 26 will terminate further sequential coupling of the outputs of delay line 11 to pulse processor 33 in response to the termination of sequential shifting by shift register 43, thus coupling the second pulse, delayed but with unaltered waveform, to pulse processor 33.

As soon as pulse processor 33 has detected this second pulse, it will develop a detection signal as noted above with regard to detection of the first pulse. This detection signal is coupled via conductor 62 to set input 60 of bistable multivibrator 61, causing bistable multivibrator 61 to set and develop a one output 63 and a zero at output 64. The entire process described above with regard to the first pulse in delay line 11 is now repeated. That is, each output of delay line 11 in the direction of forward travel of a pulse through delay line 11, after the output presently connected, will be successively coupled to pulse processor 33 as the second pulse in delay line 11 passes that particular output.

As can be seen, an improved particle analyzing device has been provided which includes a novel pulse storing circuit for storing and recovering serially received pulses. Although specific circuitry has been shown and described, it is to be understood by those skilled in the art that a number of equivalents are available for certain of the components of the circuitry. For example, shift register 43 may be replaced by an up-down counter containing a number of stages equal to the number of outputs of delay line 11. Each count of the counter will cause a one control signal to be developed and coupled to multiplexer 26 via one of conductors 46 through 56. The counter will count up or in a numerically increasing order in response to a one coupled from output 63 of multivibrator 61; and down, or in decreasing numerical order in response to a one coupled from output 64 of multivibrator 61. In addition, VETO gate 78 may be replaced by an AND gate having its output coupled to VETO gate 73 and one input coupled to pulse detector 91 as presently shown. A second input of the AND gate would be coupled to output 64 of bistable multivibrator 61.

In addition, clock 68 can be designed to change frequency in response to an appropriate input signal. Output 64 of bistable multivibrator 61 can be coupled to clock 68 via conductor 94. Whenever a one is developed at output 64, the one will be coupled to clock 68 causing its frequency to increase, thereby causing multiplexer 26 to sequentially couple the outputs of delay line 11 to pulse processor 33 in a direction reverse to the direction of propagation of a pulse at a faster rate than when switching in the forward direction. This allows the succeeding pulse in delay line 11 to be more rapidly detected.

Furthermore, the method for storing and recovering serially received pulses while a preceeding pulse is being processed is also considered novel. In particular, this method includes the steps of coupling a first pulse to be processed to a delay line; detecting the first pulse; sequentially switching each output of the delay line to the processor as the pulse being processed propagates past each output in a forward direction so as to temporarily store or freeze each succeeding pulse in the delay line; sequentially switching the delay line outputs in a direction reverse to propagation of a pulse through the delay line upon completion of the processing for the first pulse; detecting a succeeding pulse in the delay line as the output past which it propagates is coupled to the pulse processor; suspending the switching while the unaltered pulse waveform is coupled to the processor; then reversing the direction of sequential switching in order to follow the succeeding pulse as it propagates past each output in the forward direction in order to continue coupling the succeeding pulse to the processor and thus freezing it in time.

What it is to be secured by Letters Patent of the United States is:

1. A pulse storing circuit for storing and recovering serially received pulses to be processed by a pulse processor, said processor including means alternately operative to develop a first signal in response to receipt of a pulse of said pulses and a second signal in response to readiness to receive a succeeding pulse of said pulses, said pulse storing circuit including in combination;

delay means having a delay path therein and operative to serially receive and propagate said pulses along said delay path in a first direction, said delay means having a plurality of output locations at points along said delay path, circuit means coupled to said delay means output locations and said processor and operative to couple a selected one of said output locations to said processor, said circuit means being operative in response to said first signal to sequentially couple in said first direction each of said succeeding output locations after said coupled one of said output locations, said circuit means being further operative in response to said second signal after said first signal to terminate coupling in said first direction and to sequentially couple each of said output locations to said processor in a direction reverse to said first direction.

2. The pulse storing circuit of claim 1 wherein said circuit means include;

clock pulse means for developing clock pulses, logic circuit means coupled to said clock pulse means and said pulse processor and operative in response to receipt of said clock pulses and said first signal to develop control signals in a first sequence, and multiplexer means coupled to said delay means, said pulse processor and said logic circuit means and operative in response to said control signals in said first sequence to sequentially couple each of said succeeding output locations to said processor in said first direction after said coupled one of said output locations.

3. The pulse storing circuit of claim 2 wherein said logic circuit means is further operative in response to clock pulses and said second signal to develop control signals in a second sequence, said multiplex means being operative in response to said control signals in said second sequence to sequentially couple each of said outputs to said processor in a direction reverse to said first direction.

4. The pulse storing circuit of claim 3 wherein said logic circuit means further includes detector means coupled to said pulse processor and said clock pulse means and operative in response to receipt of said succeeding pulse by said processor during said second sequence of control signals to inhibit said clock pulses.

5. The pulse storing circuit of claim 3 wherein said logic circuit means further includes;

first gating means coupled to said pulse processor and operative in response to said first signal to develop a first gating signal, and operative in response to said second signal to develop a second gating signal, control signal generation means coupled to said clock means, said multiplex means and said first gating means and operative in response to said first gating signal and said clock pulses to develop control signals in said first sequence, said control signal generation means being further operative in response to said clock pulses and said second gating signal to develop control signals in said second sequence.

6. The pulse storing circuit of claim 5 wherein said logic circuit means further includes detector means coupled to said pulse processor, said clock pulse means and said first gating means, said detector means being operative in response to receipt of said succeeding pulse by said processor and said second gating signal to inhibit said clock pulses.

7. The pulse storing circuit of claim 6 wherein said control signal generation means is a shift register having a plurality of stages in sequence, each stage in sequence developing one of said control signals in response to each clock pulse, said control signals being developed in increasing order through said stages in response to said first gating signal and in decreasing order through said stages in response to said second gating signal.

8. The pulse storing circuit of claim 7 wherein said plurality of shift register stages is equal in number to said plurality of delay means outputs.

9. The pulse storing circuit of claim 6 wherein said multiplex means includes a plurality of gate means each having a signal input, a signal output and a control input, said signal outputs being coupled together, said signal inputs each being coupled to one of said delay means outputs, and said control inputs being coupled to said signal generation means, said gate means each being operative in response to one of said control signals coupled thereto to couple said signal input to said signal output.

10. The pulse storing circuit of claim 6 wherein said delay means is a delay line.

11. In a system for analyzing a plurality of particles the combination including;

detecting means operative in response to sequential detection of each of said particles to develop an electrical pulse, a pulse processor for processing each developed pulse for at least a first time period, said processor including means alternately operative to develop a first signal in response to receipt of a pulse and a second signal in response to readiness to receive a succeeding pulse, delay means having a delay path therein and operative to serially receive and propagate said pulses along said delay path in a first direction, said delay means having a plurality of output locations at points along said delay path, and circuit means coupled to said delay means output locations and said processor and operative to couple a selected one of said output locations to said processor, said circuit means being operative in response to said first signal to sequentially couple in said first direction each of said succeeding output locations after said connected one of said output locations, said circuit means being further operative in response to said second signal after said first signal to terminate sequential coupling in said first direction and to sequentially couple each of said output locations to said processor in a direction reverse to said first direction.

12. The particle analyzing system of claim 11 and further including, detector means coupled to said pulse processor and said circuit means and operative in response to receipt of said succeeding pulse by said processor and said second signal to inhibit further sequential coupling of each of said output locations to said processor in a direction reverse to said first direction.

13. The particle analyzing system of claim 12 wherein said circuit means include;
   clock pulse means for developing clock pulses,
   logic circuit means coupled to said clock pulse means and said pulse processor and operative in response to receipt of said clock pulses and said first signal to develop control signals in a first sequence, and
   gate means coupled to said delay means, said pulse processor and said logic circuit means and operative in response to said control signals in said first sequence to sequentially couple each of said succeeding output locations to said processor in said first direction after said connected one of said output locations.

14. The particle analyzing system of claim 13 wherein said logic circuit means is further operative in response to said clock pulses and said second signals to develop control signals in a second sequence, said gate means being operative in response to said control signals in said second sequence to sequentially couple each of said outputs to said processor in a direction reverse to said first direction.

15. The particle analyzing system of claim 14 wherein said gate means includes a plurality of gates each having a signal input, a signal output and a control input, said signal outputs being coupled together and to said pulse processor, said signal inputs each being coupled to one of said delay means outputs, said control inputs being coupled to said signal generation means, said gates each being operative in response to one of said control signals coupled thereto to couple said signal input to said signal output.

16. The particle analyzing system of claim 15 wherein said logic circuit means further includes,
   first gating means coupled to said pulse processor and operative in response to said first signal to develop a first gating signal and operative in response to said second signal to develop a second gating signal,
   control signal generation means coupled to said clock means, said gate means and said first gating means and operative in response to said first gating signal and said clock pulses to develop said control signals in said first sequence,
   said control signal generation means being further operative in response to said clock pulses and said second gating signal to develop said control signals in said second sequence.

17. The particle analyzing system of claim 16 wherein said control signal generation means is a shift register having a plurality of stages in sequence, each stage in sequence developing one of said control signals in response to each clock pulse, said control signals being developed in increasing order through said stages in response to said first gating signal and in decreasing order through said stages in response to said second gating signal.

18. The particle analyzing system of claim 17 wherein said plurality of shift register stages is equal in number to said plurality of delay means outputs.

19. The particle analyzing system of claim 18 wherein said delay means is a delay line.

20. The method for storing and recovering serially received pulses to be processed by a pulse processor wherein the pulse processor requires at least a first time period to analyze and process said pulses, said pulse processor including means alternately operative to develop a first signal in response to receipt of a pulse of said pulses and second signal in response to readiness to receive a succeeding pulse of said pulses, and wherein said pulses are coupled to a delay line having a plurality of output locations, said method including the steps of;
   coupling the pulse of said pulses to be processed to the delay line propagation therethrough in a first direction,
   coupling said pulse of said pulses from said delay line through a connected output location to said pulse processor,
   scanning said delay line in response to said first signal so as to sequentially connect in said first direction each of said succeeding output locations after said connected output location,
   reversing the direction of scan through said delay line in response to said second signal after said first signal so as to terminate sequential connecting in said first direction and to sequentially connect each of said output locations to said processor in a direction reverse to said first direction.

21. The method of storing and recovering serially received pulses of claim 20 further including the steps of;
   detecting said succeeding pulse being coupled to said pulse processor,
   inhibiting further scanning of said delay line in said direction reverse to said first direction.

* * * * *

UNITED STATES PATENT OFFICE
CERTIFICATE OF CORRECTION

Patent No. 3,973,108                    Dated August 3, 1976

Inventor(s) Walter R. Hogg

It is certified that error appears in the above-identified patent and that said Letters Patent are hereby corrected as shown below:

Column 2, line 14, change "the" (first occurrence) to -- that --

Column 3, line 38, change "one" to -- "one" --;

line 54, change "one" to -- "one" --;

line 60, change "one" to -- "one" --;

line 62, change "one" to -- "one" --;

Column 3, line 62, change "zero" to -- "zero" --.

Column 4, line 49, change "the output" to -- that output --;

line 54, after "line" insert -- 11 --;

line 55, after "pulse," delete -- 11 --.

UNITED STATES PATENT OFFICE
CERTIFICATE OF CORRECTION

Patent No. 3,973,108                 Dated August 3, 1976

Inventor(s) Walter R. Hogg

It is certified that error appears in the above-identified patent and that said Letters Patent are hereby corrected as shown below:

Column 5, line 30, change "7" to -- 72 --;

line 33, before "This" insert a period;

line 57, after "by" delete -- the --;

line 58, change "apulse" to -- pulse --.

Column 10, line 33, after "line" insert -- for --.

Signed and Sealed this

Seventeenth Day of May 1977

[SEAL]

Attest:

RUTH C. MASON
*Attesting Officer*

C. MARSHALL DANN
*Commissioner of Patents and Trademarks*